(12) United States Patent
Kim et al.

(10) Patent No.: US 9,054,104 B2
(45) Date of Patent: Jun. 9, 2015

(54) SEMICONDUCTOR DEVICE

(71) Applicant: SK HYNIX INC., Icheon (KR)

(72) Inventors: Doc Jin Kim, Icheon (KR); Seung Jin Lee, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/135,076

(22) Filed: Dec. 19, 2013

(65) Prior Publication Data

US 2014/0332977 A1 Nov. 13, 2014

(30) Foreign Application Priority Data

May 13, 2013 (KR) ........................ 10-2013-0053892

(51) Int. Cl.
*H01L 23/522* (2006.01)
*H01L 23/31* (2006.01)
*H01L 23/29* (2006.01)
*H01L 23/00* (2006.01)

(52) U.S. Cl.
CPC .......... *H01L 23/522* (2013.01); *H01L 23/3192* (2013.01); *H01L 23/293* (2013.01); *H01L 23/562* (2013.01)

(58) Field of Classification Search
CPC ............. H01L 2224/05647; H01L 2224/0401; H01L 27/0207; H01L 25/528; H01L 27/14636; H01L 24/83
USPC ................................................... 257/773, 774
See application file for complete search history.

(56) References Cited

U.S. PATENT DOCUMENTS

2002/0190336 A1* 12/2002 Shimizu et al. ............... 257/459
2006/0131578 A1* 6/2006 Nasuno et al. ................. 257/48

FOREIGN PATENT DOCUMENTS

JP 10-2000-0056451 A 9/2000

* cited by examiner

*Primary Examiner* — Roy Potter

(57) ABSTRACT

A semiconductor device includes a metal pad formed over a semiconductor substrate; a dummy metal pad spaced apart from the metal pad by an open region; and a Polymide Isoindro Quirazorindione (PIQ) layer formed to cover the open region and to define a pad open region by exposing a center part of the metal pad. The semiconductor device forms an additional open region at a region spaced apart from an edge part of the pad open region, preventing short-circuiting between the metal pad and the adjacent circuit line which might be caused by a crack generated at the edge of the pad open region when a probe is connected to the metal pad, and further preventing a defective semiconductor device from being generated.

24 Claims, 3 Drawing Sheets

SEMICONDUCTOR DEVICE

CROSS-REFERENCE TO RELATED APPLICATION

The priority of Korean patent application No. 10-2013-0053892 filed on 13 May 2013, the disclosure of which is hereby incorporated by reference in its entirety, is claimed.

BACKGROUND

Embodiments relate to a semiconductor device, and more particularly to a semiconductor device including a pad unit.

Generally, most of high-integrated semiconductor devices has been formed by stacking conductive layers (for example, a metal layer and an insulation film), and has been manufactured by interconnecting upper and lower conductive layers.

With the increasing precision and complexity of manufactured products, the number of stacked conductive layers increases in proportion to the increasing precision and complexity. If the number of stacking and patterning processes increases, the number of conductive layers accordingly increases. Thus, a bonding pad having a multi-layered conductive film may be used. Accordingly, many solutions for solving the problems encountered by stacked conductive layers formed in the semiconductor integrated circuit (IC) have been proposed. However, still many issues related to a bonding pad formed of a multi-layered conductive layer and related to a probe pad.

FIG. 1(i) is a plan view illustrating the semiconductor device, and FIG. 1(ii) is a cross-sectional view illustrating the semiconductor device taken along the line X-X' of FIG. 1(i).

Referring to FIG. 1(i), the semiconductor device includes a metal pad 22, an adjacent circuit line 20 spaced apart from the metal pad 22, and an insulation film 26 configured to cover the adjacent circuit line 20 and one side of the metal pad 22. In this case, the insulation film 26 is partially etched to interconnect the metal pad 22 and the probe so that a fuse-open region 30 is defined. A defective or faulty semiconductor device caused by misalignment of the fuse-open region will hereinafter be described with reference to FIG. 1(ii).

Referring to FIG. 1(ii), the semiconductor device includes an interlayer insulation film 12 formed over a semiconductor substrate 10, a metal line 14 formed over the interlayer insulation film 12, an interlayer insulation film 16 formed over the metal line 14, a contact plug 18 formed over the metal line 14 to pass through the interlayer insulation film 16, a circuit line 20 formed over the interlayer insulation film 16, a metal pad 22 formed over the interlayer insulation film 16 so as to be coupled to a contact plug 18, an insulation film 24 formed over the circuit line 20 and the metal pad 22, and a Polymide Isoindro Quirazorindione (PIQ) layer formed over the insulation film 24. For connection to the probe, the metal pad 22 is exposed by etching the PIQ layer 26 and the insulation film 24. Here, a region formed by the exposed metal pad 22 is referred to as a fuse-open region 30.

When the probe is coupled to the fuse-open region 30, defective products may occur due to an insufficient process margin. For example, since the probe pin is configured to press the edge of the pad open region 30 or some parts of the PIQ layer 26, stress is applied to the fuse-open region, causing defects to products.

Stress is generated not only along an interface between the PIQ layer 26 and the insulation film 24 but also along an interface between the insulation film 24 and the metal pad 22. For example, there may arise a defective part (A) formed when the PIQ layer 26 comes off from the insulation film 24 may occur, and there may arise a defective part (B) causing a crack due to stress applied to an edge of the metal pad 22. In this case, the generated crack is transferred to the interlayer insulation film 16 formed below the metal pad 22, such that there may arise a defective part (C) caused when the interlayer insulation film 16 comes off from the lower metal line 14, resulting in a crack caused by an adjacent circuit line 20. In this case, since ions move from the metal line 14 along the crack, the metal pad 22 may be short-circuited to the circuit line 20.

SUMMARY

Various embodiments are directed to providing a semiconductor device to address issues of the related art.

An embodiment relates to a semiconductor device to address the above issues that stress is applied to a region adjacent to the pad open region when a probe is coupled to the pad open region, and a crack unavoidably occurs, resulting in electrical short-circuiting between the pad open region and the adjacent circuit line.

In accordance with an aspect of an embodiment, a semiconductor device includes: a metal pad formed over a semiconductor substrate; a dummy metal pad spaced apart from the metal pad by an open region; and a Polymide Isoindro Quirazorindione (PIQ) layer formed to cover the open region and define a pad open region by exposing a center part of the metal pad.

The semiconductor device may further include: a first contact plug formed below the metal pad.

The semiconductor device may further include a second contact plug formed below the dummy metal pad.

The semiconductor device may further include a metal line coupled to a lower portion of the first contact plug and the second contact plug.

The semiconductor device may further include a circuit line spaced apart from the dummy metal pad.

The semiconductor device may further include an insulation film formed over the metal pad and the dummy metal pad.

The insulation film may be formed by a high density plasma (HDP) method.

The insulation film may include a concave region formed over the open region.

In accordance with another aspect of the embodiment, a semiconductor device includes: a metal pad formed over a semiconductor substrate; an open region formed at a side of the metal pad; and a Polymide Isoindro Quirazorindione (PIQ) layer formed to cover the open region and define a pad open region by exposing a center portion of the metal pad. The open region may include a slot shape.

The metal pad may include the open region includes a slot and the metal pad includes a dummy metal pad spaced apart from a center portion of the metal pad by the open region.

The semiconductor device may further include a first contact plug formed below the metal pad.

The semiconductor device may further include a second contact plug formed below the dummy metal pad.

The semiconductor device may further include a metal line coupled to lower parts of the first contact plug and the second contact plug.

The semiconductor device may further include a circuit line spaced apart from the dummy metal pad.

The semiconductor device may further include an insulation film formed over the metal pad and the dummy metal pad.

The insulation film may be formed by a high density plasma (HDP) method.

The insulation film may include a concave region formed over the open region.

In accordance with another aspect of the embodiment, a semiconductor device includes: a metal pad formed in a pad open region; a circuit line spaced apart from the metal pad; and a dummy pattern formed between the metal pad and the circuit line.

The metal pad and the dummy pattern are formed at substantially a same integration level.

The metal pad, the dummy pattern, and the circuit line are formed at substantially a same integration level.

The dummy pattern is spaced apart from the metal pad, and the dummy pattern is insulated from the circuit line.

The dummy pattern is in island type and separated from the metal pad by a space, and wherein the dummy pattern is insulated from the circuit line.

The dummy pattern extends from the metal pad and is spaced apart from the metal pad by a slot, and wherein the dummy pattern is insulated from the circuit line.

The semiconductor device further comprises a metal line coupled to the metal pad and the dummy pattern through first and second contact plugs, respectively.

It is to be understood that embodiments are exemplary and explanatory and are not intended to be limiting.

DESCRIPTION OF EMBODIMENTS

Reference will now be made in detail to certain embodiments, examples of which are illustrated in the accompanying drawings. Wherever possible, the same reference numbers will be used throughout the drawings to refer to the same or like parts.

Although a crack is generated in a metal pad due to stress caused by a probe when the probe is coupled to the pad open region, the semiconductor device according to an embodiment can prevent occurrence of short-circuiting between a separate open region formed at the edge of the pad open region and a dummy metal spaced apart from the metal pad by the separate open region when ions of the metal pad move to an adjacent circuit line. A detailed description thereof will hereinafter be described with reference to FIGS. 2(i)-(ii).

Figure 2:
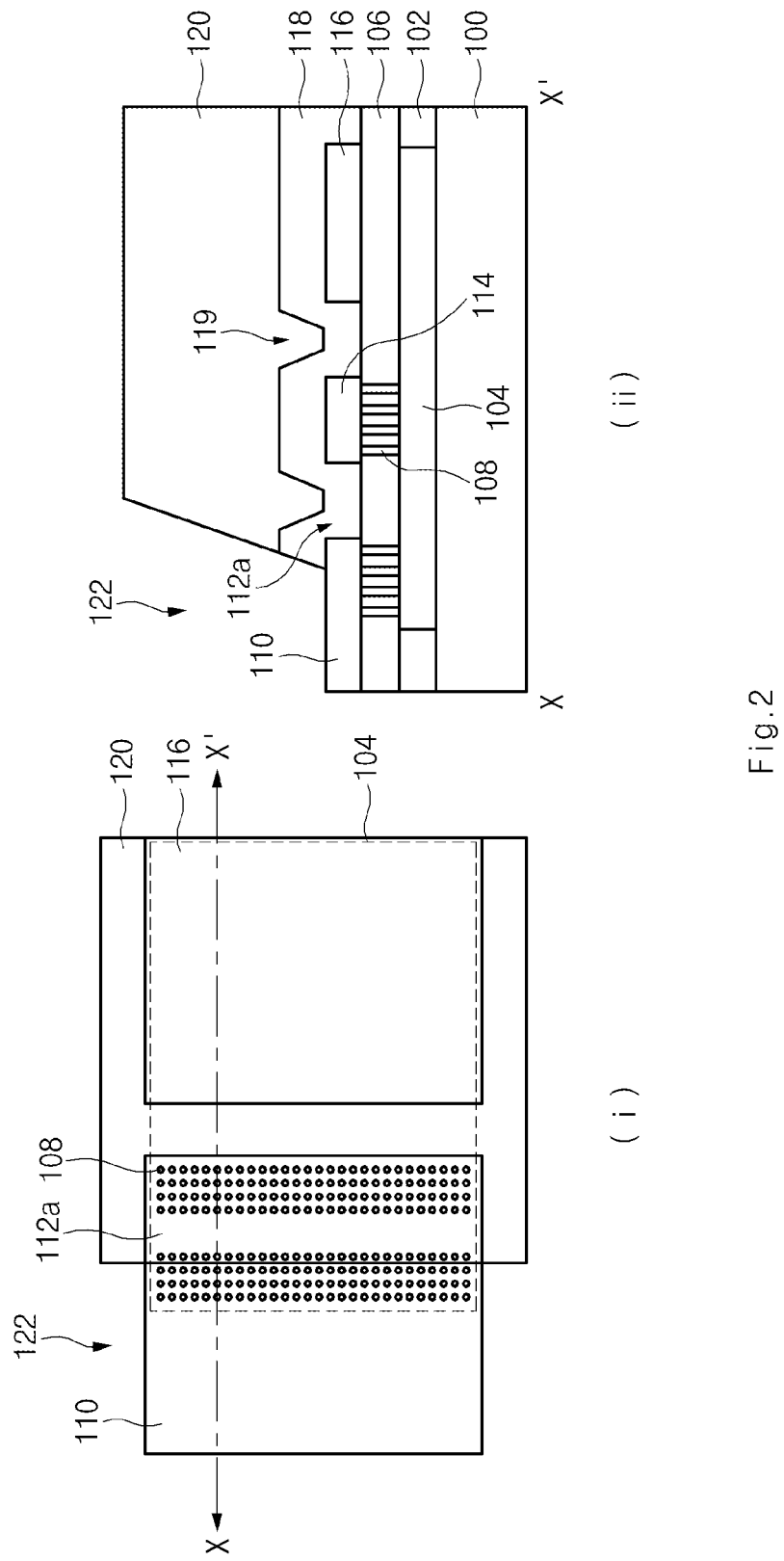
FIG. 2(i) is a plan view illustrating a semiconductor device, and FIG. 2(ii) is a cross-sectional view illustrating the semiconductor device taken along the line X-X' of FIG. 2(i).

FIG. 2(i) is a plan view illustrating the semiconductor device, and FIG. 2(ii) is a cross-sectional view illustrating the semiconductor device taken along the line X-X' of FIG. 2(i).

Referring to FIG. 2(i), the semiconductor device according to an embodiment includes a metal pad 110, a dummy metal pad 114 spaced apart from the metal pad 110, and a circuit line 116 spaced apart from the dummy metal pad 114. Here, the metal pad 110 and the dummy metal pad 114 are spaced apart from each other by the first open region 112a. The first open region 112a includes a space by which the metal pad 110 and the dummy metal pad 114 are spaced apart from each other.

Contact plugs 108 may be coupled to an edge of the metal pad 110 and the dummy metal pad 114. A metal line 104 may be formed below the metal pad 110, the dummy metal pad 114, and the circuit line 116. Preferably, a pad open region (or pad contact region) 122 may be defined by a PIQ layer (or passivation layer) 120 that covers the first open region 112a and exposes a center portion of the metal pad 110.

The reason why the PIQ layer 120 defines the pad open region 122 by covering the first open region 112a is to prevent a crack from being applied to the adjacent circuit 116. The dummy metal pad 114 dislocated by the first open region is used as a barrier when a crack occurs in the metal pad 110 due to stress applied to the pad open region 122 while the metal pad 110 is connected to the probe.

Meanwhile, the first open region 112a of the semiconductor device according to an embodiment includes a space by which the metal pad 110 and the dummy metal pad 114 are spaced apart from each other for convenience of description and better understanding. However, embodiments are not limited thereto.

Figure 3:
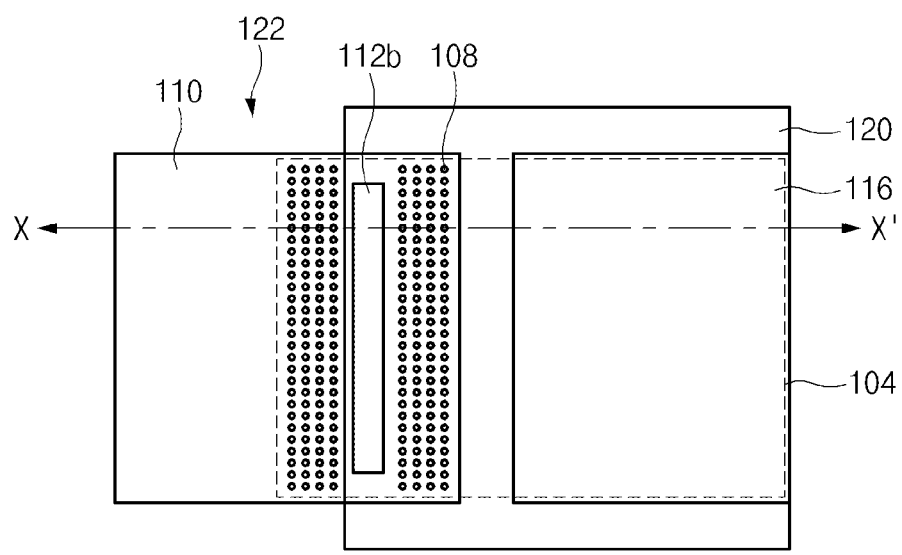
FIG. 3 is a plan view illustrating a semiconductor device according to an embodiment.

FIG. 3 is a plan view illustrating a semiconductor device according to an embodiment. Referring to FIG. 3, the semiconductor device according to another embodiment includes a second open region 112b formed at an edge of the metal pad 110. In this case, the second open region 112b may include a slot included in the metal pad 110. Accordingly, as shown in FIG. 2, the metal pad 110 is not completely divided into two or more pieces by the second open region 112b. Instead, some parts of the pad are partially patterned to form a slot. However, a cross-sectional view of the semiconductor device taken along the line X-X' of FIG. 3 may be identical in shape to the cross-sectional view of the semiconductor device taken along the line X-X' of FIG. 2(i). That is, although the semiconductor device does not include a completely separate pattern such as in the dummy metal pad 114 as shown in FIG. 2(ii), a slot such as a second open region 112b formed in the metal pad 110 including may operate the similar function as the dummy metal pad 114. A principle that prevents the crack caused by stress generated when the probe is coupled to the pad open region 122 from being applied to the adjacent circuit 116 will hereinafter be described with reference to FIG. 2(ii).

Referring to FIG. 2(ii), the semiconductor device includes an interlayer insulation film 102 formed over a semiconductor substrate 100, a metal line 104 formed over the interlayer insulation film 102, an interlayer insulation film 106 formed over the metal line 104, and a contact plug 108 configured to penetrate the interlayer insulation film 106. A dummy metal pad 114 is formed over the contact plug 108 and coupled to the metal line 104 through the contact plug 108. A metal pad 110 is coupled to an upper portion of the contact plug 108. The metal pad 110 and the dummy metal pad 114 are spaced apart from each other by the open region. In this case, a first open region 112a of FIG. 2(i) may be alternative to a second open region 112b shown in FIG. 3

For convenience of description and better understanding, although the pattern spaced apart from the metal pad 110 by the open region 112a or 112b is referred to as a dummy metal pad 114, this pattern may include any pattern, e.g., the first open region 112a shown in FIG. 2(i), a slot-type pattern such as the second open region 112b shown in FIG. 3, etc.

A circuit line 116 spaced apart from the dummy metal pad 114 may further be formed over the interlayer insulation film 106. Preferably, a voltage different from those of the metal pad 110 and the dummy metal pad 114 may be applied to the circuit line 116. The same voltage may be applied to the metal pad 110 and the dummy metal pad 114.

Figure 1:
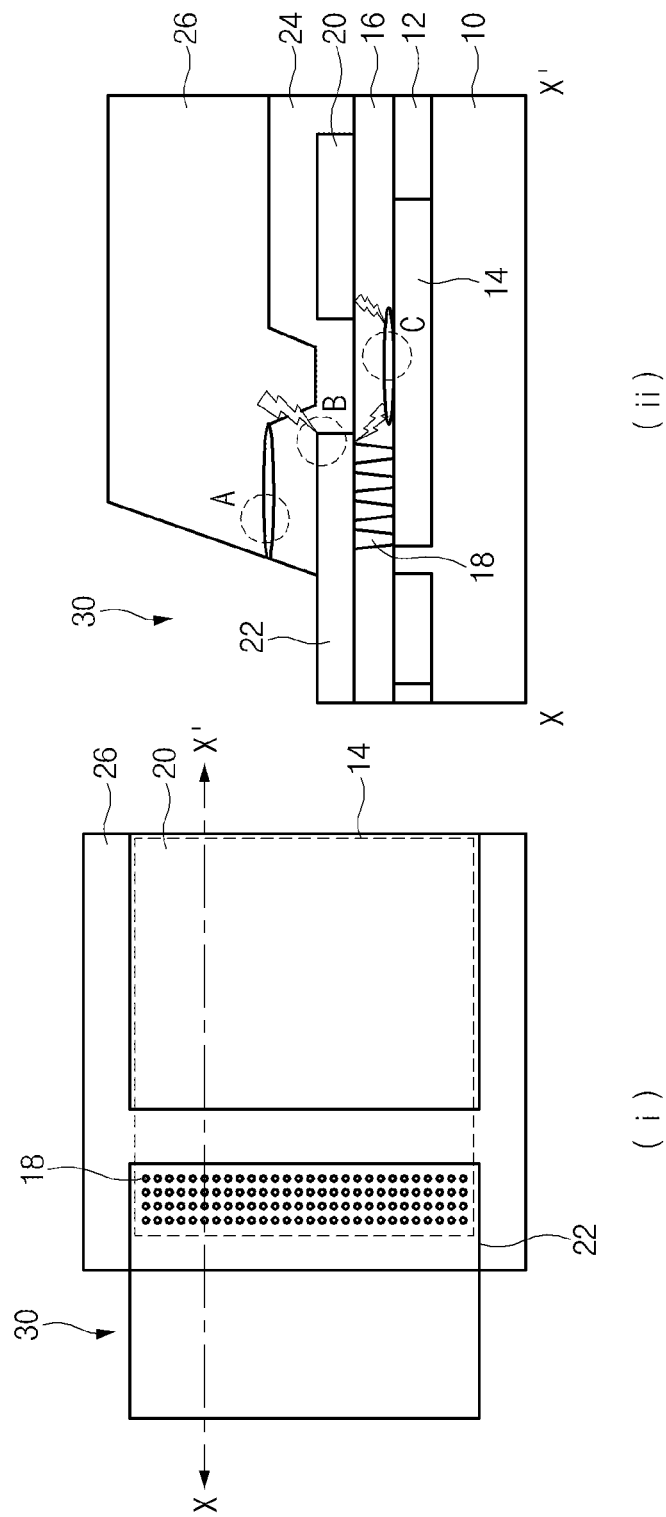
FIG. 1(i) is a plan view illustrating a semiconductor device, and FIG. 1(ii) is a cross-sectional view illustrating the semiconductor device taken along the line X-X' of FIG. 1(i).

According to embodiments, even though the metal pad 110 is dislocated or distorted by a pressure due to a contact with a probe, the short-circuiting between the metal pad 110 and the circuit line 116 can be prevented because the dummy metal pad 114 can serve as a buffer to prevent an electric contact between the metal pad 110 and the circuit line 116 via a crack created in the region "C" shown in FIG. 1.

An insulation film 118 may further be formed over the metal pad 110, the dummy metal pad 114, and the circuit line 116. The insulation film 118 may include an insulation layer formed by a High Density Plasma (HDP) scheme. The insulation film 118 may include an open region 112a and a concave region 119 filling a space between the dummy metal pad 114 and the circuit line 116. That is, since a specific region such as (i) the open region 112a formed between the open region 112 and the dummy metal pad 114, and (ii) the space between the dummy metal pad 114 and the circuit line 116 is formed to expose the interlayer insulation film 106, the insulation film 118 is formed over the interlayer insulation film 106 exposed by the specific region. The insulation film 118 formed in the specific region has a lower height than the insulation film 118 formed over the dummy metal pad 114 and the circuit line 116, creating the concave region 119.

A PIQ layer 120 may further be formed over the insulation film 118. The PIQ layer 120 is formed over the insulation film 118 to cover an upper part of the open region 112 while exposing the metal pad 110 such that a pad open region 122 is defined.

Stress may be applied to a peripheral part of the pad open region 122 when the metal pad 110 is coupled to the probe. Therefore, a crack occurs along a surface of the metal pad 110. In this case, a crack may be transferred to the contact plug 108 and the interlayer insulation film 106 under a lower portion of the metal pad 110. However, the crack is prevented from further transferring because of the dummy metal pad 114 and the contact plug 108 formed below the dummy metal pad 114. Accordingly, ions from the metal pad 110 are prevented from moving to the circuit line 116 due to the presence of the dummy metal pad 114 and the contact plug 108 formed below the dummy metal pad 114. Thus, short-circuiting between the metal pad 110 and the circuit line 116 can be prevented.

In addition, the concave region 119 formed over the insulation film 118 may prevent a dislocation phenomenon caused by stress applied to the insulation film. That is, if PIQ 120 and the insulation film 118 are in contact with flatways, an adhesive strength between the PIQ 120 and the insulation film 118 is lower than the concave region 119. If the concave region 119 forms, low-adhesive-strength parts (flat part) are reduced. The low-adhesive-strength parts contained in the insulation film is reduced by the concave region 119, such that a path created by a crack can be prevented from being generated.

As described above, the semiconductor device according to embodiments prevents a crack caused by stress when the probe is coupled to the pad open region from being transferred to an internal circuit line by the dummy metal pad spaced apart from the metal pad, such that short-circuiting between the metal pad and the internal circuit line can be prevented.

As is apparent from the above description, the semiconductor device according to embodiments forms an additional open region to be spaced apart from the edge part of the pad open region, can prevent short-circuiting between the metal pad and the adjacent circuit line by a crack generated at the edge of the pad open region when the metal pad is connected to the probe, and prevents a defective semiconductor device from being generated.

The above exemplary embodiments are therefore to be construed in all aspects as illustrative and not restrictive.

The above embodiments are illustrative and not limitative. Various modifications are possible. The embodiments are not limited to the type of deposition, etching polishing, and patterning steps described herein. Nor are the embodiments limited to any specific type of semiconductor device. For example, the embodiments may be implemented in a dynamic random access memory (DRAM) device or non-volatile memory device.

What is claimed is:

1. A semiconductor device comprising:
   a metal pad formed over a semiconductor substrate;
   a dummy metal pad spaced apart from the metal pad by an open region; and
   a Polymide Isoindro Quirazorindione (PIQ) layer formed to cover the open region and define a pad open region by exposing a center part of the metal pad.

2. The semiconductor device according to claim 1, further comprising:
   a first contact plug formed below the metal pad.

3. The semiconductor device according to claim 2, further comprising:
   a second contact plug formed below the dummy metal pad.

4. The semiconductor device according to claim 3, further comprising:
   a metal line coupled to a lower portion of the first contact plug and the second contact plug.

5. The semiconductor device according to claim 1, further comprising:
   a circuit line spaced apart from the dummy metal pad.

6. The semiconductor device according to claim 1, further comprising:
   an insulation film formed over the metal pad and the dummy metal pad.

7. The semiconductor device according to claim 6, wherein the insulation film is formed by a high density plasma (HDP) method.

8. The semiconductor device according to claim 6, wherein the insulation film includes a concave region formed over the open region.

9. A semiconductor device comprising:
   a metal pad formed over a semiconductor substrate;
   an open region formed at a side of the metal pad; and
   a Polymide Isoindro Quirazorindione (PIQ) layer formed to cover the open region and define a pad open region by exposing a center portion of the metal pad.

10. The semiconductor device according to claim 9, wherein the open region includes a slot.

11. The semiconductor device according to claim 9, wherein the metal pad includes a dummy metal pad spaced apart from a center portion of the metal pad by the open region.

12. The semiconductor device according to claim 11, further comprising:
    a first contact plug formed below the metal pad.

13. The semiconductor device according to claim 12, further comprising:
    a second contact plug formed below the dummy metal pad.

14. The semiconductor device according to claim 13, further comprising:
    a metal line coupled to lower portions of the first contact plug and the second contact plug.

15. The semiconductor device according to claim 11, further comprising:
    a circuit line spaced apart from the dummy metal pad.

16. The semiconductor device according to claim 11, further comprising:
    an insulation film formed over the metal pad and the dummy metal pad.

17. The semiconductor device according to claim 16, wherein the insulation film is formed by a high density plasma (HDP) method.

18. The semiconductor device according to claim 16, wherein the insulation film includes a concave region formed over the open region.

19. A semiconductor device comprising:
   a metal pad formed in a pad open region;
   a circuit line spaced apart from the metal pad;
   a dummy pattern formed between the metal pad and the circuit line; and
   a metal line coupled to the metal pad and the dummy pattern through first and second contact plugs, respectively.

20. The semiconductor device of claim 19,
   wherein the metal pad and the dummy pattern are formed at substantially a same integration level.

21. The semiconductor device of claim 19,
   wherein the metal pad, the dummy pattern, and the circuit line are formed at substantially a same integration level.

22. The semiconductor device of claim 19,
   wherein the dummy pattern is spaced apart from the metal pad, and
   wherein the dummy pattern is insulated from the circuit line.

23. The semiconductor device of claim 19,
   wherein the dummy pattern is an island type and separated from the metal pad by a space, and
   wherein the dummy pattern is insulated from the circuit line.

24. The semiconductor device of claim 19,
   wherein the dummy pattern extends from the metal pad and is spaced apart from the metal pad by a slot, and
   wherein the dummy pattern is insulated from the circuit line.

* * * * *